United States Patent [19]

Meusburger et al.

[11] 4,197,554

[45] Apr. 8, 1980

[54] MONOLITHICALLY INTEGRATED CIRCUIT ARRANGEMENT COMPRISING ONE-TRANSISTOR STORAGE ELEMENTS

[75] Inventors: Guenther Meusburger, Munich; Karlheinrich Horninger, Eglharting, both of Fed. Rep. of Germany

[73] Assignee: Siemens Aktiengesellschaft, Berlin & Munich, Fed. Rep. of Germany

[21] Appl. No.: 898,489

[22] Filed: Apr. 20, 1978

[30] Foreign Application Priority Data

May 6, 1977 [DE] Fed. Rep. of Germany ....... 2720533

[51] Int. Cl.² .......................................... H01L 27/02
[52] U.S. Cl. ..................................... 357/51; 357/23; 357/41; 357/55; 357/45
[58] Field of Search .................... 357/23, 41, 45, 51, 357/55

[56] References Cited

U.S. PATENT DOCUMENTS

| 3,387,286 | 6/1968 | Dennard | 357/41 |
| 4,115,795 | 9/1978 | Masuoka et al. | 357/41 |

FOREIGN PATENT DOCUMENTS 2553591  3/1977  Fed. Rep. of Germany ............ 357/41

OTHER PUBLICATIONS

IBM—Tech. Bul.—vol. 17, No. 6, Nov. 1974.
Electronic Letters—Mar. 18, 1976, pp. 140-141.

*Primary Examiner*—Edward J. Wojciechowicz
*Attorney, Agent, or Firm*—Hill, Van Santen, Steadman, Chiara & Simpson

[57] ABSTRACT

A monolithic integrated circuit arrangement is disclosed which is formed of a group of one-transistor storage elements arranged on a semiconductor layer. Each storage element has a selection field effect transistor and a storage capacitor. The storage elements are arranged in pairs. First and second storage capacitors of each pair are combined to save storage area. In one embodiment, a first conductive coating overlying a surface of the semiconductor layer is employed as a common second electrode for all the storage capacitors. Additional second conductive coatings insulated from the first conductive coating and arranged thereover form the first electrodes for the storage capacitors. In another embodiment a first conductive coating is employed as a common second electrode for the storage capacitors. A second conductive coating is utilized as a first electrode for some of the storage electrodes while an inversion or diffusion layer is utilized as a first electrode for the other storage capacitors. In a final embodiment a first conductive coating over the semiconductor layer is utilized as a common second electrode for all of the storage capacitors. A second conductive coating over the first conductive coating and insulated therefrom is utilized as a first electrode for some of the storage capacitors whereas other storage capacitors have their first electrode formed as an inversion layer adjacent to a shift electrode.

11 Claims, 4 Drawing Figures

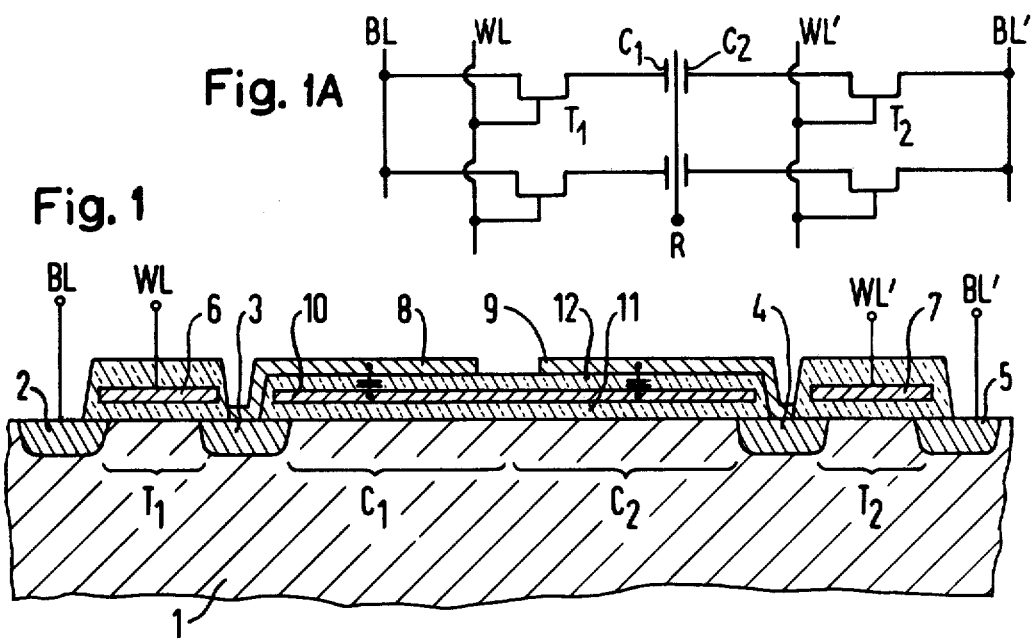
Fig. 1A
Fig. 1
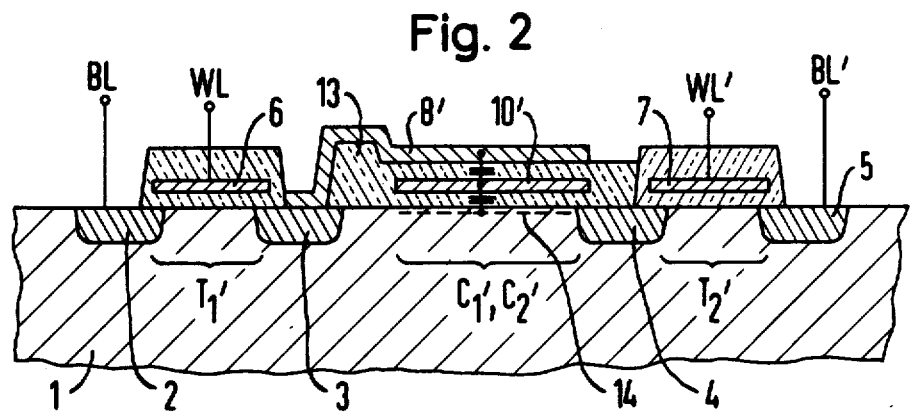
Fig. 2
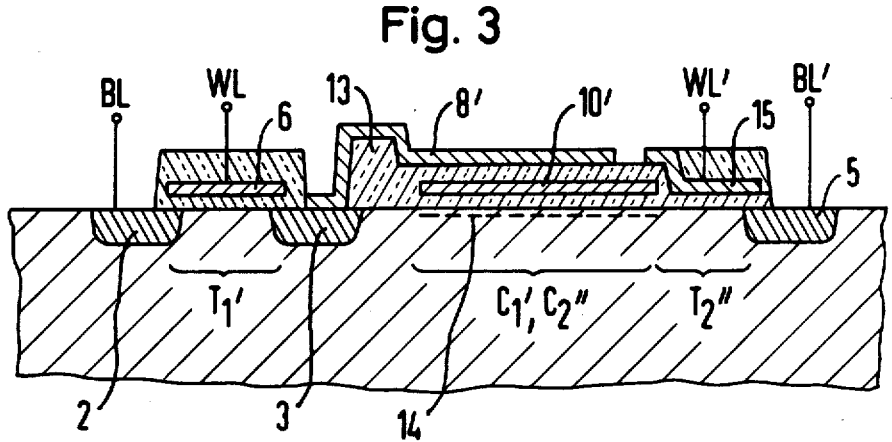
Fig. 3

MONOLITHICALLY INTEGRATED CIRCUIT ARRANGEMENT COMPRISING ONE-TRANSISTOR STORAGE ELEMENTS

BACKGROUND OF THE INVENTION

The invention relates to a monolithically integrated circuit arrangement wherein a group of one-transistor storage elements is provided arranged on a semiconductor layer. Each storage element is formed of a selection MIS field effect transistor and a storage capacitor. One electrode of the storage capacitor is fed with information potential to be stored, and is electrically connected to the drain zone of the field effect transistor. Source terminals of the field effect transistors of some of the group of storage elements are connected to a common bit line and gate terminals of field effect transistors of other of the storage elements are connected to a common world line.

A circuit arrangement of this type is disclosed in the German AS No. 25 53 591 and the magazine "Electronic Letters", Vol. 12, No. 6, Mar. 18, 1976, pages 140–141. A strip-shaped zone is provided which is oppositely doped to the semiconductor layer and which is connected to a reference potential R. The zone connects to reference electrodes arranged on a surface of the semiconductor substrate and consist, in particular, of inversion layers of the MIS storage capacitors of a plurality of storage elements. Here a MIS storage capacitor is understood as a capacitor which possesses a metallic gate electrode which is separated from a silicon layer by an insulating layer. This metallic gate electrode can be replaced by an electrically conductive gate electrode consisting of highly doped semiconductor material such as, for example, polysilicon. The items of data stored in the individual storage elements are governed by the voltages connected to the gate electrodes of the relevant MIS storage capacitors relative to the reference potential fed through the strip-shaped zone. Furthermore, between the storage capacitor zone and the field effect transistor of each individual storage element, there is arranged a zone in which the insulating layer which covers the surface of the semiconductor layer is fundamentally thicker than beneath the gate electrode of the storage capacitor. This prevents the inversion layer of the storage capacitor which forms on the surface of the semiconductor layer from extending to the drain zone of the assigned field effect transistor.

SUMMARY OF THE INVENTION

An object of the present invention is, in circuit arrangements of the type described above, to reduce the area required for the storage elements on the semiconductor layer in order to accommodate more storage capacity on a given storage area, or in order to reduce the overall semiconductor surface required for a given storage capacity.

This is achieved in accordance with the invention by combining the storage capacitors by providing a common first conductive layer which operates as a second electrode for each of the storage capacitors and second conductive layers formed above the first conductive layer and which form first electrodes of the storage capacitors.

In accordance with a further development of the invention, the aforesaid object is realized also by combining storage capacitors of a pair of the storage elements wherein a first conductive layer above the semiconductor layer is formed as a common second electrode for all of the storage capacitors. A second conductive layer above the first conductive layer is utilized as a first electrode for some of the storage capacitors while an inversion or diffusion layer below the first and second conductive layers functions as a first electrode for other of the storage capacitors.

In accordance with a further development of the invention, this object is further realized by combining storage capacitors of the storage elements wherein a first conductive layer above the semiconductor layer functions as a common second electrode for all of the storage capacitors. A second conductive layer above the first conductive layer operates as a first electrode for some of the first capacitors while an inversion layer below the first and second conductive layers operates as a first electrode for other of the storage capacitors. This inversion layer is positioned adjacent to a shift electrode of a shift transistor which is provided for some of the field effect transistors of the storage elements.

Circuit arrangements in accordance with the invention are characterized by particularly simple structural techniques which result in a very effective reduction in the surface of the semiconductor layer required for the storage elements.

BRIEF DESCRIPTION OF THE DRAWINGS

FIG. 1 illustrates a first circuit arrangement in accordance with the invention in which two storage elements arranged beside one another have been illustrated;

FIG. 1A illustrates a schematic diagram of the circuit arrangement of FIG. 1;

FIG. 2 illustrates another circuit arrangement in accordance with the invention comprising a pair of storage elements whose storage capacitor zones are arranged one above another; and FIG. 3 illustrates another circuit arrangement in accordance with the invention comprising a pair of storage elements whose storage capacitor zones are likewise arranged one above another.

DESCRIPTION OF THE PREFERRED EMBODIMENTS

In FIGS. 1 and 1A, a p-conducting semiconductor layer 1 consisting, for example, of silicon, is provided with n-conducting diffusion zones 2 to 5, of which 2 signifies the source zone, and 3 the drain zone of a first selection MIS field effect transistor $T_1$. The source zone 2 simultaneously represents part of a doped bit line which is provided with a terminal BL. The gate electrode, referenced 6, of $T_1$, simultaneously represents part of a word line which is connected with a terminal WL. 4 and 5 designate the drain and source zones respectively of a second selection MIS field effect transistor $T_2$ whose gate electrode is designated 7. Here 5 and 7 are again parts of a bit line and word line respectively which are connected to corresponding terminals BL' and WL'. The aforementioned word lines and bit lines are common to a plurality of similarly designed selection transistors arranged on the semiconductor layer 1.

$T_1$ is supplemented by a storage capacitor $C_1$ to form a first storage element, and $T_2$ is supplemented by a storage capacitor $C_2$ to form a second storage element. Here 8 represents an electrode of $C_1$ which is connected to the drain zone 3 of $T_1$. Consequently, in the conductive state of $T_1$, which is produced by the connection of a specific potential to WL, an item of data applied to the bit line terminal BL and represented by a predetermined potential, is fed via zones 2 and 3 to the electrode 8 and is thus stored in $C_1$. The electrode of $C_2$ corresponding to the electrode 8 is referenced 9. 10 represents a common reference electrode to the electrodes 8 and 9 and is designed in such manner such as in the form of a strip, so that it constitutes a reference electrode which is common to all the storage capacitors arranged on the semiconductor layer 1. In FIG. 1 the storage capacitors $C_1$ and $C_2$ are indicated by capacitor symbols shown between the electrodes 8, 10 and 9, 10.

The reference electrode 10 which is common to the storage capacitors is formed from an electrically conductive coating which is arranged above an insulating layer 11 consisting for example of $SiO_2$ which covers the surface of the semiconductor layer 1. The shape of the electrode 10 is achieved preferably by employing photolithographic steps known per se. Above the electrode 10 there is then provided a further insulating layer 12 which consists, for example of $SiO_2$, and which is then provided with a further coating of an electrically conductive material. By employing further photolithographic process steps, finally the electrodes 8 and 9 which are electrically insulated from one another, and the corresponding electrodes of the other storage capacitors (not shown) are produced from this material. In order to connect these electrodes to the drain zones of the associated selection field effect transistors, prior to the application of the coating 8, 9 the insulating layer 11 must be removed above the zones 3, 4 etc. so that the recesses thus formed are also coated. The reference electrode 10 which is common to all the storage capacitors prevents the formation of inversion layers in the semiconductor layer 1 beneath the electrodes 8 and 9 so that the regions of the storage capacitances $C_1$ and $C_2$ can be arranged closely beside the drain zones 3 and 4. This results in a considerable reduction in area in comparison to known storage elements of this type.

FIG. 2 illustrates a circuit arrangement wherein the storage elements arranged on the semiconductor layer 1 are combined in pairs. One such pair has been illustrated and referenced $T_1'$, $C_1'$ and $T_2'$, $C_2'$. 10' designates a reference electrode which is common to the two illustrated storage capacitors $C_1'$ and $C_2'$ and to the other storage capacitors which have not been shown. The electrode of $C_1'$ which is supplied with an information potential to be stored via BL, zones 2 and 3, in the manner already described with reference to FIG. 1, is referenced 8'. It differs from the electrode 8 in FIG. 1 since its shape defines a zone 13 of the insulating layer lying beneath it which is thicker than the zone lying beneath the electrode 8'. The storage capacitance $C_2'$ of the right-hand storage element $T_2'$, $C_2'$ possesses an electrode which consists of an inversion layer 14 formed on the surface of the semiconductor layer 1 beneath 8'. The inversion layer consists of charge carriers which, when the selection transistor $T_2'$ is in the conductive state, (i.e. when a specific potential supplied via WL' and the associated word line is connected to the gate 7) emerge from the drain zone 4 through the information potential communicated via BL' and the assigned bit line to the zone 5. In place of this inversion layer 14, it is also possible to provide a diffusion layer which is doped oppositely to 1 and which is connected to the drain zone 4. As can be directly seen from FIG. 2, the storage capacitor zones of those storage elements which are combined in pairs are arranged one above another relative to the semiconductor layer 1. This results in a very substantial reduction in storage area within the individual pairs of elements.

The circuit arrangement illustrated in FIG. 3 differs from the arrangement in FIG. 2 in that the drain zone 4 has been omitted and the electrode 7 has been replaced by a so-called shift electrode 15 which extends, except for a very small gap, to the common electrode 10'. This forms a charge shift arrangement $T_2''$, in which the inversion layer 14 is formed by the charge carriers which, when a predetermined potential is fed via WL' to the electrode 15, have emerged from the source zone 5 fed via BL' with the potential to be stored and have been transported to that zone of the semiconductor layer 1 indicated by 14.

The electrically conductive coatings 8, 9, 10 and 10' preferably consist of strongly doped semiconductor material, e.g. polysilicon, or are designed as metallic coatings. The illustrated and described storage elements have their potential controlled via the word lines WL, WL', the bit lines BL, BL', and the circuit components 10, 10' which carry a reference potential for the purpose of write-in, read-out, and regeneration of information in known manner as also described in detail in the German AS No. 2 553 591.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A monolithically integrated circuit arrangement comprising:

a group of one-transistor storage elements which are arranged on a semiconductor layer and which each have a storage capacitor with first and second electrodes and a selection MIS (metal-insulator-semiconductor) field effect transistor;

the first electrode of the storage capacitor being fed with an information potential to be stored and being conductively connected to the drain zone of the field effect transistor;

source terminals of the field effect transistors of some of the group of storage elements being connected to a common bit line and gate terminals of the field effect transistors of some of the storage elements each being connected to a common word line;

an insulating layer covering a surface of the semiconductor layer;

a first conductive coating arranged above the insulating layer forming a reference electrode which is the second electrode of and which is a common electrode to the storage capacitors of all the storage elements and is connected to a reference potential; and above the first conductive coating and separated from the latter by a further insulating layer a plurality of insulated second conductive coatings being formed as said storage capacitor first electrodes.

2. A circuit arrangement as claimed in claim 1, characterized in that at least one of the first and second conductive coatings comprise a strongly doped polysilicon semiconductor material.

3. A circuit arrangement as claimed in claim 1, characterized in that at least one of the first and second conductive coatings is a metallic coating.

4. A monolithically integrated circuit arrangement comprising:
   a group of one-transistor storage elements which are arranged on a semiconductor layer and which each have a selection MIS (Metal-Insulator-Semiconductor) field effect transistor and a storage capacitor with first and second electrodes;
   the first capacitor electrode being fed with an information potential to be stored and being conductively connected to the drain zone of the field effect transistor;
   source zones of the field effect transistors of a plurality of storage elements of the group being connected to a common bit line;
   gates of the field effect transistors of a plurality of storage elements of the group being connected to a common word line;
   the storage elements of the group being combined in pairs of first and second storage elements so that regions of first and second storage capacitors of each pair lie one above another with respect to the semiconductor layer;
   an insulating layer covering the surface of the semiconductor layer;
   a first conductive coating on said insulating layer forming a reference electrode which is a common second electrode for the first and second capacitors and said reference electrode also being a common second electrode for all the storage capacitors of said group of storage elements and is connected to a reference potential;
   above the first conductive coating and separated from the latter by a further insulating layer a second conductive coating being arranged for the first of the storage elements of each pair and which forms the first capacitor electrode of the first storage capacitor of each pair; and
   the first electrode of the second storage capacitor of each pair being formed as a layer at the surface of the semiconductor layer approximately beneath the first electrode of the first storage capacitor of each pair of storage elements.

5. The arrangement of claim 4 in which the first electrode of the second storage capacitor of each pair comprises a diffused layer in the semiconductor layer.

6. The arrangement of claim 4 in which the first electrode of the second storage capacitor of each pair comprises an inversion layer in the semiconductor layer.

7. A circuit arrangement as claimed in claim 4, characterized in that at least one of the first and second conductive coatings comprise a strongly doped polysilicon semiconductor material.

8. A circuit arrangement as claimed in claim 4, characterized in that at least one of the first and second conductive coating is a metallic coating.

9. A monolithically integrated circuit arrangement comprising:
   a group of one-transistor storage elements which are arranged on a semiconductor layer and which each have a selection MIS (Metal-Insulator-Semiconductor) field effect transistor and a storage capacitor with first and second electrodes;
   the first electrode of the storage capacitor being fed with an information potential to be stored, said first electrode being conductively connected to a drain zone of the field effect transistor in some of the elements of the group and adjacent a shift electrode of a shift type field effect transistor in other elements of the group;
   source terminals of the field effect transistors of a plurality of storage elements of the group being connected to a common bit line;
   gate terminals of field effect transistors of a plurality of storage elements of the group being connected to a common word line;
   the storage elements of the group being combined in pairs of first and second storage elements;
   regions of first and second storage capacitors of each pair lying one above another relative to the semiconductor layer;
   above an insulating layer covering a surface of the semiconductor layer a first conductive coating being arranged forming a reference electrode as a common second electrode of the first and second capacitors of each pair and which is also common to all the second electrodes of all the storage capacitors of the group of storage elements and is connected to a reference potential;
   above the first conductive coating and separated from the latter by a further insulating layer a second conductive coating being arranged which forms the first electrode of the first storage capacitor of each pair;
   the second electrode of each of the second storage capacitors of each pair comprising an inversion layer arranged at the surface of the semiconductor layer approximately beneath the first electrode of the first storage capacitor of each pair, said inversion layer extending to a shift electrode of a shift transistor, said shift transistor comprising a shift field effect transistor of each of said second storage elements of the pairs.

10. A circuit arrangement as claimed in claim 9, characterized in that at least one of the first and second conductive coatings comprise a strongly doped polysilicon semiconductor material.

11. A circuit arrangement as claimed in claim 9, characterized in that at least one of the first and second conductive coating is a metallic coating.

* * * * *